United States Patent [19]

Glessner, Jr. et al.

[11] Patent Number: 4,646,419
[45] Date of Patent: Mar. 3, 1987

[54] METHOD FOR ENGAGING A SUBSTRATE

[75] Inventors: Charles W. Glessner, Jr., Upper Makefield Township, Bucks County, Pa.; Kazimierz Przydzial, Clark Township, Union County, N.J.

[73] Assignee: AT&T, New York, N.Y.

[21] Appl. No.: 852,001

[22] Filed: Apr. 14, 1986

[51] Int. Cl.⁴ .............................................. B23Q 1/00
[52] U.S. Cl. ....................................... 29/559; 29/271; 269/52; 269/903; 269/329
[58] Field of Search ............................. 269/47, 50–52, 269/310, 74, 77, 82, 70, 903, 329; 279/1 L; 29/271, 559

[56]  References Cited
U.S. PATENT DOCUMENTS

| 1,135,983 | 4/1915 | Bartlett | 269/51 |
| 2,865,089 | 12/1958 | Machian | 29/203 |
| 3,135,043 | 6/1964 | Anderson et al. | 29/271 |
| 3,142,889 | 8/1964 | Austen | 29/155.5 |
| 3,162,936 | 12/1964 | Soderman | 29/203 |
| 3,518,745 | 7/1970 | Gray et al. | 29/271 |
| 3,725,993 | 4/1973 | Siler | 29/271 |
| 3,793,720 | 2/1964 | Van Rijsewijk et al. | 29/626 |
| 3,878,597 | 4/1975 | Hoskins | 29/271 |
| 3,988,815 | 11/1976 | Petree | 29/33 K |
| 4,078,302 | 3/1978 | Fok et al. | 29/741 |
| 4,516,318 | 5/1985 | Kirschenman | 29/846 |
| 4,555,840 | 12/1985 | Nakamura | 29/271 |
| 4,565,358 | 1/1986 | Hosoi et al. | 269/60 |

FOREIGN PATENT DOCUMENTS 2315724 10/1974 Fed. Rep. of Germany ...... 269/310
606686 5/1978 U.S.S.R. .............................. 279/1 L

OTHER PUBLICATIONS

General Instrument Corp., Technical Information Bulletin MCA8-MCA81, Slotted Optical Limit Switch.

Primary Examiner—Robert C. Watson
Attorney, Agent, or Firm—R. B. Levy

[57] ABSTRACT

An apparatus (10) for engaging a printed circuit board (12) positioned in rough alignment therewith comprises an housing (14) having a bore (16) which is partially tapered (20). Loosely mounted within the bore is a sleeve (24) having a tapered portion (30) complementary to the tapered portion (20) of the bore. A pin (36) is spring-biased within the sleeve and extends therefrom beyond the housing for insertion into a tooling hole (76) in the printed circuit board upon movement of the sleeve into the bore in the housing. While the tapered portion (30) on the sleeve remains spaced from the tapered section (20) of the bore, the pin is capable of limited lateral movement about the axis of the bore which virtually eliminates wedging or sticking thereof in the tooling hole. Once the sleeve is fully inserted into the housing, the tapered portion on the sleeve nests with the tapered section of the bore, rigidly locking the pin in place.

5 Claims, 3 Drawing Figures

METHOD FOR ENGAGING A SUBSTRATE

TECHNICAL FIELD

This invention relates generally to a method and apparatus for engaging a substrate, such as a printed circuit board.

BACKGROUND OF THE INVENTION

Most electronic equipment produced today incorporates one or more printed circuit boards, each having electronic components mounted thereon. The mounting of components on the printed circuit board is usually accomplished automatically by machines constructed for this purpose. Machines for mounting components to printed circuit boards are known in the art and are available from a number of commercial vendors. While the structural details of such machines vary, each typically includes a stage for supporting a printed circuit board thereon in registration with a mechanism for placing components on the circuit board. In practice, the stage carries two or more machanisms for engaging the circuit board to fix the location thereof on the stage a set distance from the component placement mechanism.

In order for a component mounting machine to achieve high circuit board throughput, the mechanisms theron for engaging the circuit board must be capable of rapid and reliable operation. Further, the circuit board engagement mechanisms must be capable of rigidly holding the circuit board in place to avoid shifting thereof during the placement of components thereon. Shifting of the circuit board on the stage can cause misplacement of components. This problem is especially critical when components such as chip carriers are placed with the leads therof in contact with bonding pads on the circuit board. In some instances the spacing between chip carrier leads is as small as 0.025 inches so even very small shifts in the position of the circuit board can result in misalignment of the leads with the bonding pads on the circuit board.

In the past, mechanisms for engaging a circuit board have typically included a pin which is dimensioned for receipt in a tooling hole located adjacent to the edge of the circuit board. The pin is rigidly affixed to a shaft of an actuator, such as a fluid cylinder or electrically operated solenoid fixedly carried by the stage. In order for the engaging mechanism to fix the location of the circuit board on the stage, the circuit board is first indexed to align the tooling hole therein in registration with the pin. The actuator is then energized to insert the pin into the tooling hole and thereby capture the printed circuit board.

The rigidity of the pin may cause it to become wedged or stuck in the tooling hole when rapidly inserted therein if the tooling hole is misaligned with the pin. Such misalignment may arise because of variations in the location of the tooling hole in the circuit board caused by manufacturing tolerances. The wedging and sticking problem can be reduced by increasing the diameter of the tooling holes. However, increasing the diameter of the tooling holes reduces the area on the circuit board that can be occupied by components, which is undesirable. Moreover, increasing the size of the tooling holes can lead to increased play between the circuit board and each of the pins, thereby resulting in possible misplacement of components on the circuit board.

Accordingly, there is a need for a technique for rapidly and accurately engaging a substrate, such as a circuit board, to hold it in place.

SUMMARY OF THE INVENTION

Briefly, the foregoing disadvantages are substantially overcome by the method of the present invention for engaging a substrate having at least one aperture therein. The substrate is first roughly aligned to locate the aperture in registration with a pin which is capable of limited lateral movement about an axis perpendicular to the plane of the substrate. Thereafter, a relative motion is imparted between the pin and the substrate to locate the pin within the aperture. The pin is then locked against lateral movement so that when the pin has been located in the aperture, the substrate is held in place thereby.

DETAILED DESCRIPTION

Figure 1:
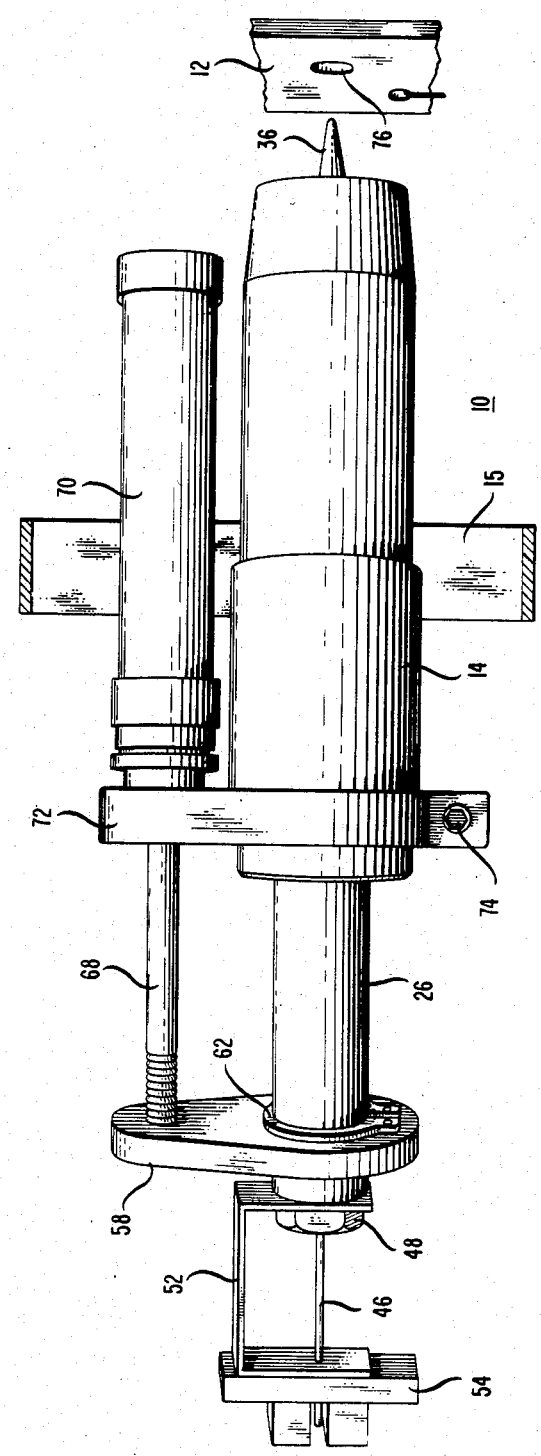
FIG. 1 is a frontal view of the pin capture station of the present invention.
Figure 2:
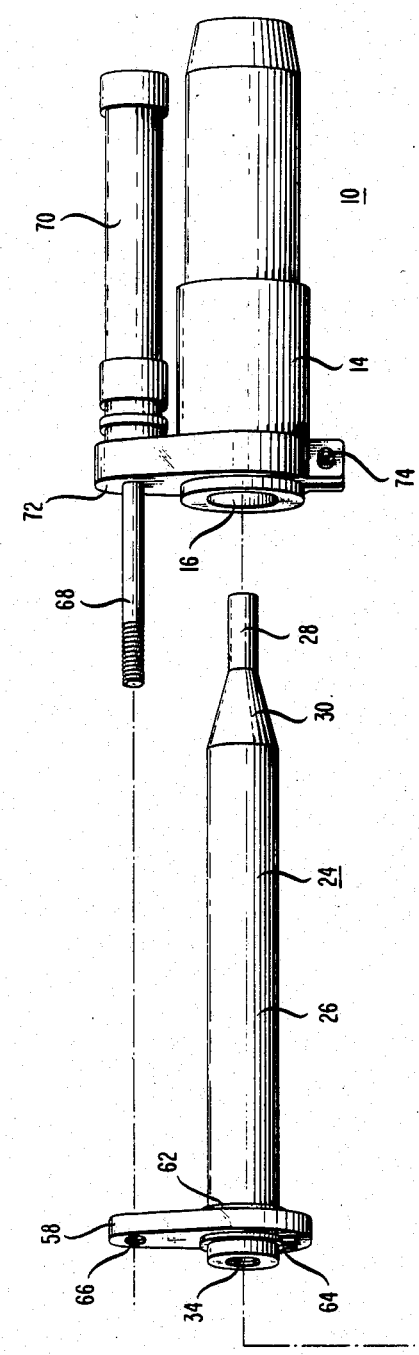
FIG. 2 is an exploded view of the pin capture station FIG. 1.
Figure 2:
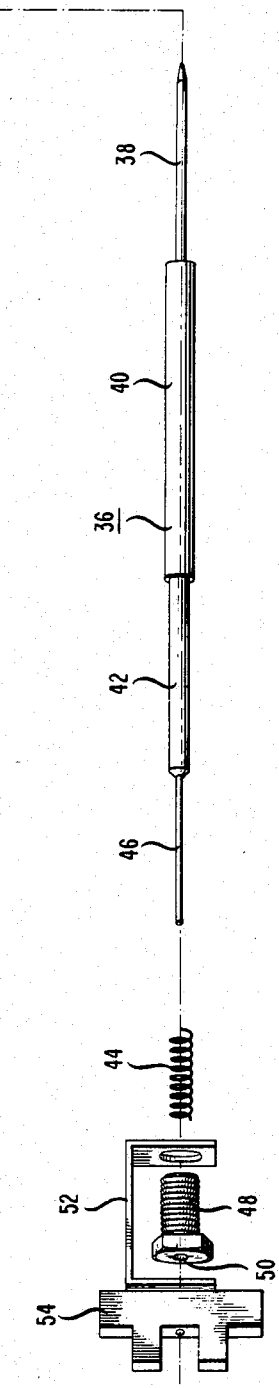
Figure 3:
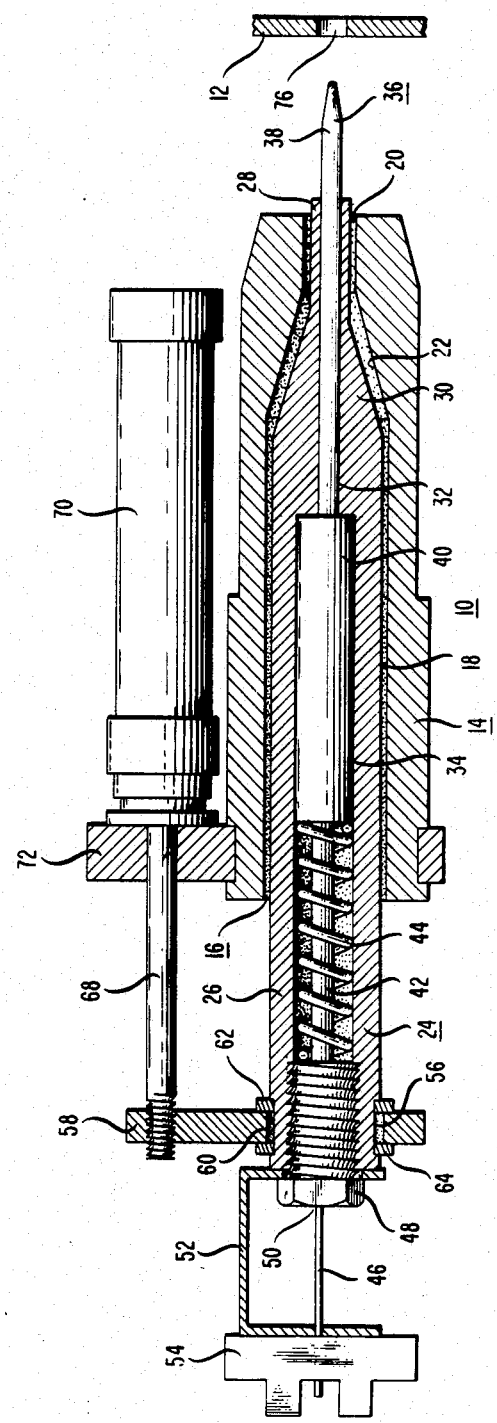
FIG. 3 is a cross-sectional view of the pin capture station of FIGS. 1 and 2.

FIGS. 1-3 illustrate a mechanism 10 for engaging a substrate 12 (e.g., a printed circuit board), positioned a short distance therefrom. The mechanism 10 comprises a housing 14 which, in practice, is cylindrical in shape. Clamping means (not shown) secure the housing 14 to a stationary member 15 which typically comprises part of a machine for mounting components on the printed circuit board 12.

As best illustrated in FIGS. 2 and 3, the housing 14 has a coaxial bore 16 therethrough. The bore 16 has a first portion 18 which is interconnected to a second portion 20 of a reduced diameter by a tapered section 22 extending therebetween as seen in FIG.3. A sleeve 24 is inserted into the bore 16. The sleeve 24 has a body section 26, a reduced diameter tip 28 and a tapered section 30 extending therebetween. In practice, the body section 26 and the tip 28 of the sleeve 24 are each of a slightly smaller diameter than the first and second portions 18 and 20, respectively, of the bore 16 so that a 0.020-0.030 inch clearance exists therebetween.

Referring to FIG. 3, while the sleeve 24 is positioned within the bore 16 such that the tapered section 30 is spaced from, and out of contact with the tapered section 22, the sleeve can move laterally a limited distance from the axis of the bore. Once the sleeve 24 is positioned such that the tapered section 30 thereof seats or nests against the tapered section 22 of the bore 16, the sleeve no longer enjoys any lateral freedom of movement from the axis of the bore. Thus, the sleeve 24 becomes rigid with the housing 14.

The sleeve 24 has a passage 32 therethrough coaxial with the bore 16 in the housing 14. A counter-bore 34 extends into the body section 26 of the sleeve 24 coaxial with the passage 32 to a point just short (to the left) of the tapered section 30. A pin 36 is inserted through the counter-bore 34 and into the passage 32 for slidable movement therein. Referring to FIGS. 2 and 3, the pin 36 is comprised of several different sections. At the right hand end of the pin 36 is a tip 38 which is slightly smaller in diameter than the passage 32 so as to be slidably received therein.

Leftwardly of the tip 38 on the pin 36 is a first body section 40 larger in diameter than the tip but smaller in diameter than the counter-bore 34 for slidable movement, therein. Extending leftwardly from the first body section 40 is a second body section 42 which is of a smaller diameter. The reduced diameter of the second body section 40 allows a spring 44 to be carried thereby within the confines of the counter-bore 34 (see FIG. 3). Extending leftwardly (as seen in FIG. 3) from the second body second section 42 of the pin 36 is an end section 46, the diameter of which is smaller than the tip 38. In practice, the overall length of the pin 36 is such that upon insertion thereof into the sleeve 24, the end section 46 of the pin extends therefrom.

A plug 48, having a passage 50 therethrough sized to accomodate the end section 46 of the pin 36, is threaded into the counter-bore 34 in the body section 26 of the sleeve 24. When threaded into the sleeve 24, the plug 48 compresses the spring 44, causing the spring to urge the tip 38 of the pin 36 out from the housing 14 until the first body section 40 of the pin contacts the right hand end of the counter-bore 34. The magnitude of the force of the spring 44 against the pin 36 can be adjusted by varying the distance to which the plug 48 is threaded into the sleeve 34.

In addition to compressing the spring 44, the plug 48 also secures a "C"-shaped bracket 52 to the sleeve 24. Note that when the plug 48 is not threaded completely into the sleeve 24 it may be necessary to provide one or more washers (not shown) between the plug and the bracket 52 to assure a tight fit thereof against the sleeve. The bracket 52 has a passage (not shown) therein sized to receive the end section 46 of the pin 36.

A sensor 54 is carried by the bracket 52 in registration with the passage therein. In an exemplary embodiment, the sensor 54 comprises a model MCA8 slotted optical limit switch manufactured by General Instrument Corporation, Hicksville, N.Y. While the pin 36 is biased within the sleeve 24 by the spring 44 so the tip 38 protrudes beyond the right hand end of the housing 14 as seen in FIGS. 1 and 3, the end section 46 of the pin remains out of contact with the sensor 54. However, should the tip 38 of the pin be urged into the housing 14, the end section 46 of the pin will be forced out from the sleeve 24 through the bracket 52 and into the sensor 54, causing it to become actuated.

Referring to FIG. 3, the sleeve 24 has a circumferential notch 56 in the periphery thereof a short distance to the right of the plug 48. The notch 56 is circumscribed by a yoke 58 whose thickness is smaller than the width of the notch. The yoke 58 has a bore 60 therethrough of a sufficient diameter to allow the yoke to be carried on the sleeve 24 within the notch and still provide a small degree of play therebetween. A first and second "C" washers 62 and 64, respectively, circumscribe the notch 56 on opposite sides of the yoke 58 to retain the yoke in place while still permitting a small degree of play thereof with the sleeve 24.

As best seen in FIG. 2, the yoke 58 has a passage 66 through a portion thereof distant from the sleeve 24. The passage 66 is threaded to accommodate a threaded shaft 68 of an actuator 70 which may take the form of a solenoid or fluid cylinder as are well known in the art. The actuator 70 is secured to the housing 14 by a split clamp 72 which may be tightened by a screw 74. A sensor (not shown) may be provided to monitor the stroke of the actuator 70.

Capture of the circuit board 12 by the pin capture station 10 is accomplished by roughly aligning the circuit board to locate a tooling hole 76 therein proximate the edge thereof (see FIGS. 1 and 3) in registration with the axis of the bore 16 through the housing 14. Thereafter, the actuator 70 is activated to drive the sleeve 24 into the housing 14 so that the tip 38 of the pin 36 contacts the circuit board 12. If the pin 36 is misaligned with the tooling hole 76, by 1/16 of an inch or less, the play between the sleeve 24 and the housing 14, and between the yoke 58 and the sleeve affords the pin and the ability to move laterally a limited distance from the axis of the bore 16. The limited lateral movement of the pin 36 allows the pin to enter into the tooling hole 76 and thereby engage board 12. Note that the play between the sleeve 24 and the yoke 58 enables the sleeve to enter the bore 16 without binding as the pin 36 enters the tooling hole 76 when the same is slightly off-center with the pin.

When the sleeve 24 is driven fully into the housing 14, the tapered section 30 (see FIGS. 2 and 3) on the sleeve seats against the tapered section 22 on the bore 16. Once this occurs, the sleeve 24 coaxially nests within the bore 16 so there will no longer be any play therebetween. The nesting of the sleeve 24 in the bore 16 locks the pin 36 against lateral movement and in coaxial alignment with the bore 16 through the housing 14. Not only is the circuit board 12 rigidly engaged by the pin 36 at this time, but the circuit board will also have been positioned so that the tooling hole 76 is now coaxial with the bore 16. Thus if the circuit board 12 was slightly misaligned with the mechanism 10 prior to engagement by the pin, the circuit board becomes aligned therewith after engagement.

Normally, during the operation of the mechanism 10, the tip 38 of the pin 36 enters the tooling hole 76 and engages the circuit board 12. However, there may be instances when the tip 38 of the pin 36 does not enter the tooling hole 76, as may occur if circuit board 12 is not aligned with the mechanism 10 or if the tooling hole is not properly located in the circuit board. If the tip 38 on the pin doesn't enter the tooling hole 76 upon contact with the circuit board 12, then, as the sleeve 24 is driven into the housing 14, the pin 36 is urged against the spring 44. As the pin 36 is urged against the spring 44, the end section 46 of the pin enters the sensor 54, causing the sensor to be actuated. Thus, by monitoring the status of the sensor 54, failure to capture the printed circuit board 12 can be detected and appropriate action can be taken.

It is to be understood that the embodiments herein described are merely illustrative of the principles of the present invention. Various modifications and changes may be made by those skilled in the art which will embody the principles of the invention and fall within the spirit and scope thereof.

What is claimed is:

1. A method of engaging a substrate, having an aperture therein, comprising the steps of:
roughly aligning the aperture in the substrate with a pin capable of limited lateral movement about an axis perpendicular to the plane of the substrate;
imparting a relative motion between the pin and the substrate to locate the pin within the aperture; and locking the pin against any lateral movement as the pin enters the aperture so that the pin rigidly engages the substrate to hold it in place.

2. The method according to claim 1, further including the step of sensing whether the pin has entered the aperture after relative motion has been imparted between the pin and the substrate.

3. The method according to claim 1, wherein the step of locking the pin comprises the step of nesting the pin within a stationary housing as the relative motion is imparted between the pin and the substrate.

4. A method of engaging a substrate having an aperture therein comprising the steps of:

indexing the substrate to roughly align the aperture therein in registration with a pin which is spring-biased within, and extends beyond, a sleeve having a partially tapered exterior surface, the sleeve being loosely mounted for slidable movement within a bore through a stationary housing so the sleeve and pin enjoy limited lateral movement relative thereto, the bore having a tapered portion complementary to the tapered portion of the sleeve for nesting therewith;

urging the sleeve into the housing to extend the pin therefrom and into contact with the substrate so the pin enters the aperture; while simultaneously nesting the tapered portion of the sleeve with the tapered portion of the bore in the housing to lock the sleeve and pin against lateral movement so the substrate is rigidly held in place by the pin.

5. The method according to claim 4, further including the step of sensing whether the pin has entered the aperture after contacting the circuit board with the pin.

* * * * *